(12) United States Patent
Shakya et al.

(10) Patent No.: US 12,451,895 B2
(45) Date of Patent: Oct. 21, 2025

(54) MISMATCH SHAPING APPARATUS AND METHOD FOR BINARY CODED DIGITAL-TO-ANALOG CONVERTERS

(71) Applicant: Oregon State University, Corvallis, OR (US)

(72) Inventors: Jyotindra R. Shakya, Corvallis, OR (US); Gabor C. Temes, Corvallis, OR (US)

(73) Assignee: Kepler Computing Inc., San Francisco, CA (US)

( * ) Notice: Subject to any disclaimer, the term of this patent is extended or adjusted under 35 U.S.C. 154(b) by 156 days.

(21) Appl. No.: 18/495,711

(22) Filed: Oct. 26, 2023

(65) Prior Publication Data

US 2024/0146320 A1 May 2, 2024

Related U.S. Application Data

(60) Provisional application No. 63/381,534, filed on Oct. 28, 2022.

(51) Int. Cl.
*H03M 1/06* (2006.01)
*H03M 1/66* (2006.01)
*H03M 3/00* (2006.01)

(52) U.S. Cl.
CPC ......... *H03M 1/0604* (2013.01); *H03M 1/066* (2013.01); *H03M 1/0668* (2013.01); *H03M 3/464* (2013.01); *H03M 1/66* (2013.01)

(58) Field of Classification Search
CPC .... H03M 1/0604; H03M 1/066; H03M 3/464; H03M 1/0668; H03M 1/66

USPC .......................................... 341/118, 143, 144
See application file for complete search history.

(56) References Cited

U.S. PATENT DOCUMENTS

| | | | |
|---|---|---|---|
| 5,138,317 A | 8/1992 | Story | |
| 5,404,142 A | 4/1995 | Adams et al. | |
| 5,684,482 A | 11/1997 | Galton | |
| 5,982,317 A | 11/1999 | Steensgaard-Madsen | |
| 5,990,819 A | 11/1999 | Fujimori | |
| 6,211,805 B1 | 4/2001 | Yu | |
| 6,348,884 B1 | 2/2002 | Steensgaard-Madsen | |
| 6,697,004 B1 | 2/2004 | Galton et al. | |
| 6,737,999 B2 | 5/2004 | Schreier | |
| 8,022,850 B2 * | 9/2011 | Newman | H03M 1/0665 341/143 |
| 9,337,854 B1 * | 5/2016 | Chen | H03M 1/0673 |

* cited by examiner

*Primary Examiner* — Khai M Nguyen
(74) *Attorney, Agent, or Firm* — MUGHAL GAUDRY & FRANKLIN PC

(57) ABSTRACT

Described herein is a mismatch shaping technique applied in digital-to-analog converters (DACs) for high pass filtering mismatch related errors. The mismatch shaping scheme is based on a zero mean error encoding technique, which can be applied directly to binary coded signals, without the use for binary to thermometer decoding and element shuffling. In at least one example, an apparatus is provided which comprises a mismatch shaping circuitry to receive an N-bit binary input bits and to generate an (N+1)-bit digital output. In at least one example, the apparatus further comprises a digital-to-analog converter to receive the (N+1)-bit digital output and to generate an analog output, wherein the mismatch shaping circuitry is to encode the (N+1)-bit digital output to shape mismatch errors in the digital-to-analog converter.

20 Claims, 12 Drawing Sheets

3-bit ZMEE DAC error analysis

400

| Input Digital Code b[3:1] | Output of the ZMEE (radix-3) d[4:1] | Cumulative error for each bit (number of errors $e_4$ to $e_1$) |
|---|---|---|
| 001 | [0,0,0,1] | [0,0,0,1] |
| 001 | [0,0,1,-1] | [0,0,1,0] |
| 001 | [0,0,0,1] | [0,0,1,1] |
| 001 | [0,1,-1,-1] | [0,1,0,0] |
| 001 | [0,0,0,1] | [0,1,0,1] |
| 001 | [0,0,1,-1] | [0,1,1,0] |
| 001 | [0,0,0,1] | [0,1,1,1] |
| 001 | [1,-1,-1,-1] | [1,0,0,0] |
| 001 | [0,0,0,1] | [1,0,0,1] |
| 001 | [0,0,1,-1] | [1,0,1,0] |

Fig. 4

ZMEE Algorithm Pseudocode

```
function [D,E] = ZMEE(B,E)
% B[N:1] : N-bit Input Binary Code, MSB to LSB
% E[N:1] : N-bit Binary Cumulative error per bit
         from previous conversion stored externally
% D[(N+1):1] : (N+1)-bit Ternary Output ZMEE Code
    N = length(B)
    D = [B 0]
    for k = 1 to N
        C = null row vector
        if (D(k)>0) AND (E(k)>0)
            D(k) = -1
            C(k+1) = 1
        endif
        if (D(k)<0) AND (E(k)<=0)
            D(k) = 1
            C(k+1) = -1
        endif
        D = D+C
    endfor
    E = E+D[N:1]
Endfunction
```

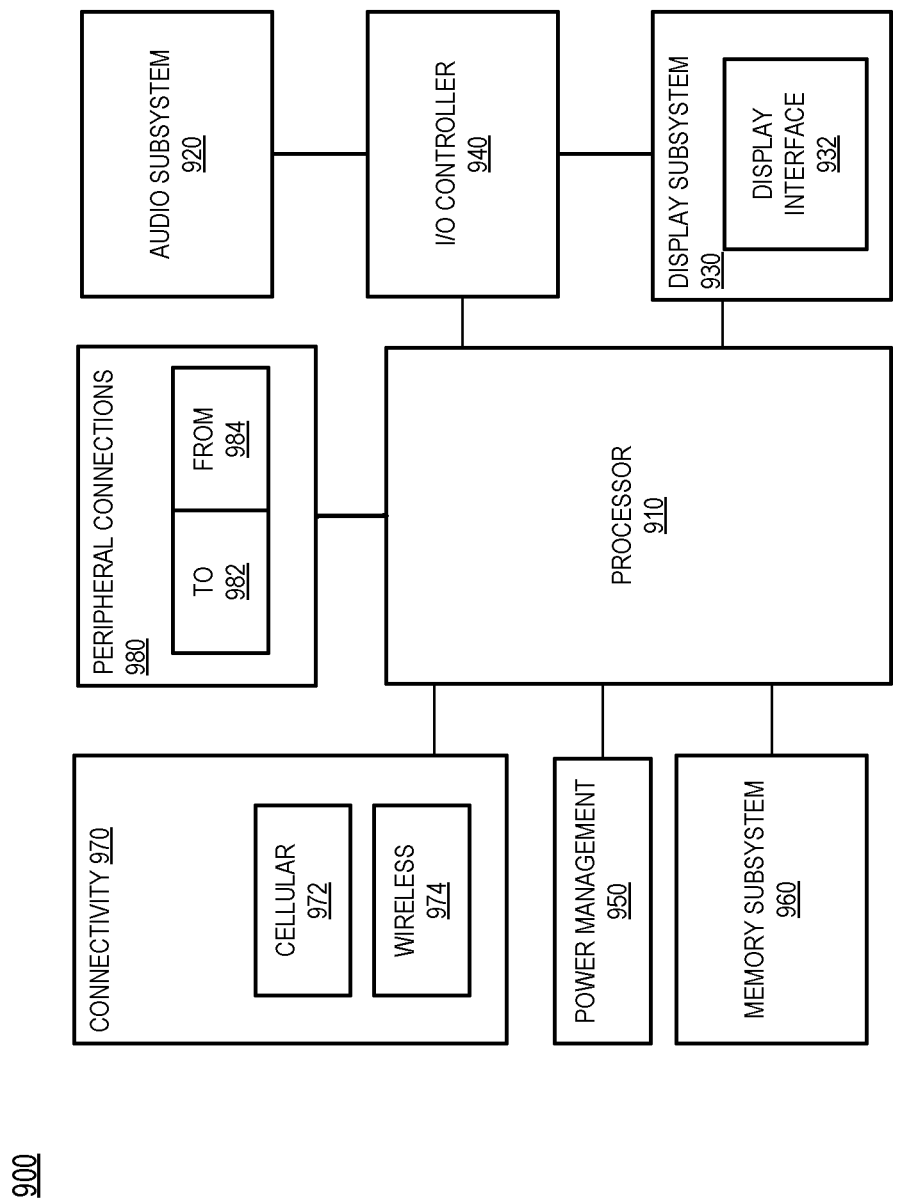

MISMATCH SHAPING APPARATUS AND METHOD FOR BINARY CODED DIGITAL-TO-ANALOG CONVERTERS

CLAIM OF PRIORITY

This Application is a non-provisional of, and claims the benefit of priority to, U.S. Provisional Patent Application No. 63/381,534, filed on Oct. 28, 2022, and titled "MISMATCH SHAPING APPARATUS AND METHOD FOR BINARY CODED DIGITAL-TO-ANALOG CONVERTERS," which is incorporated by reference in its entirety for all purposes.

BACKGROUND

Mismatch in individual elements of digital-to-analog converters (DACs) is a factor that limits its accuracy. When a DAC with mismatch is used as a feedback DAC in delta-sigma analog-to-digital converters (ADCs), it also degrades the accuracy of analog-to-digital conversion. Therefore, DAC mismatch errors are of concern for both digital-to-analog conversion as well as analog-to-digital conversion.

BRIEF DESCRIPTION OF THE DRAWINGS

The examples of the disclosure will be understood more fully from the detailed description given below and from the accompanying drawings of various examples of the disclosure, which, however, should not be taken to limit the disclosure to the specific examples, but are for explanation and understanding only.

FIG. 4 is a table showing an encoder's output for a sequency of 001 digital input code.

FIG. 6A illustrates a pseudocode of the ZMEE scheme, in accordance with at least one example.

FIG. 9 illustrates a computer system with a DAC using the ZMEE scheme, in accordance with at least one example.

DETAILED DESCRIPTION

Figure 1:
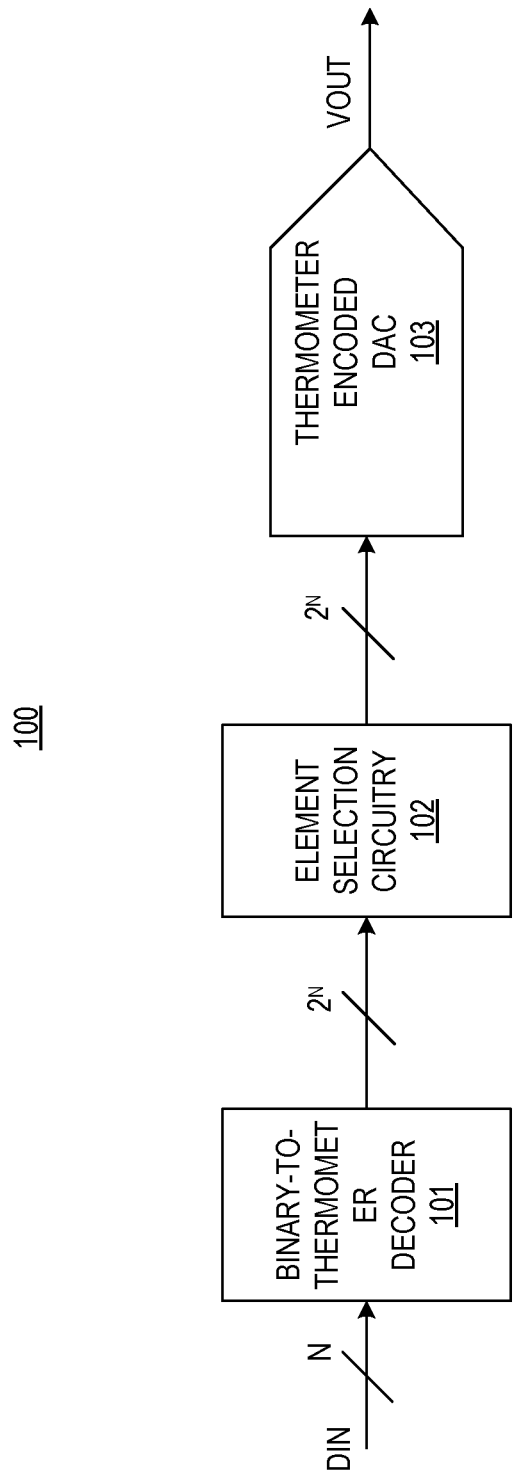
FIG. 1 is a schematic that illustrates a digital-to-analog converter (DAC) scheme based on dynamic element matching (DEM).

Digital-to-analog converters (DACs) can be designed using various components such as resistor, capacitors, and current sources. These components are referred to as elements of the DAC. The individual elements of the DAC are often designed with values proportional to powers of two for binary coding. For example, in a binary weighted capacitive DAC, the capacitor values are C, 2C, 4C, 8C, and so on from the least significant bit (LSB) to the most significant bit (MSB). Any deviation in the coefficients 1, 2, 4, and 8 of these capacitor values causes degradation in the DAC performance, which can be observed as an increase in the noise floor and harmonic spurs in the output spectrum. These deviations are referred to as mismatch errors.

The values of these capacitors can be controlled as precisely as the manufacturing process allows. The deviation in coefficients due to inexact manufacturing of individual elements (e.g., capacitors) on die or chip cause mismatch error. Hence, to mitigate the effects of mismatches, a mismatch shaping scheme is often used. Mismatch shaping schemes suppress mismatch related errors in the frequency range of interest. Mismatch shaping schemes are predominantly used in oversampled circuits such as delta sigma modulators (DSMs), where a small fraction of the frequency range carries the signal. Hence, the mismatch related error signal can be high-pass filtered such that its in-band effect is reduced. Here, "shaping" or "to shape" mismatch error may generally refer to changing the frequency spectrum of error such that power spectral density (PSD) of the error has a high-pass shape as such there is lower root-mean-squared (RMS) error in some desired portion of the spectrum.

One type of mismatch shaping scheme is a dynamic element matching (DEM) technique. In the DEM technique, for each code, the mismatch shaping scheme cycles through all the digital-to-analog converter (DAC) unit elements such that an average value determines the value of a certain digital code in the analog domain. The DEM technique hence expects that an individual unit element is addressable and selectable. Therefore, the dynamic element matching technique expects conversion of digital input code from binary-coded to thermometer-coded before applying such technique. Furthermore, the thermometer coded signals are to be shuffled based on a pointer such that on average all the elements are used equal number of times.

At least some examples here describe a mismatch shaping apparatus and method referred to as a zero mean error encoding (ZMEE) scheme, in which the error from each bit is bounded through negative feedback to achieve mismatch shaping. In at least one example, the ZMEE scheme can thus be applied directly to binary coded DACs without a need for binary to thermometer decoding.

In at least one example, the ZMEE scheme comprises an apparatus which includes a mismatch shaping circuitry to receive an N-bit binary input bits and to generate an (N+1)-bit digital output. In at least one example, the apparatus further includes a digital-to-analog converter to receive the (N+1)-bit digital output and to generate an analog output, wherein the mismatch shaping circuitry is to encode the (N+1)-bit digital output to shape mismatch errors in the digital-to-analog converter.

In at least one example, the ZMEE scheme comprises a method for converting a N-bit binary coded input digital signal into an analog output signal. In at least one example, the method comprises accumulating a positive or negative usage of an individual digital-to-analog converter element to generate an accumulated positive or negative usage. In at least one example, the method further comprises encoding an individual digital bit, of the N-bit binary coded input digital signal, with a normal scheme or an alternate scheme depending on the accumulated positive or negative usage, such that through negative feedback, an accumulated error contributed from the individual digital bit is bounded close to zero. In at least one example, the method further comprises providing the individual digital bit, which is encoded, to an (N+1)-bit binary weighted digital-to-analog converter which converts an (N+1)-bit digital signal into the analog output signal, wherein the (N+1)-bit binary weighted digital-to-analog converter includes the individual digital-to-analog converter element.

In at least one example, the normal scheme is applied when the individual digital bit is 1 and the accumulated error is 0, and wherein the alternate scheme is applied when the individual digital bit is −1 and the accumulated error is 1. In at least one example, the method further comprises adding a carry or borrow signal to a next higher bit of the N-bit binary coded input digital signal. In at least one example, encoding the individual digital bit is to result in an individual encoded digital bit, wherein the individual encoded digital bit is one of −1, 0, +1, and wherein the carry or borrow signal is one of −1, 0, or +1. In at least one example, accumulating the positive or negative usage is performed by an N 1-bit up/down counter.

The examples of the disclosure will be understood more fully from the detailed description given below and from the accompanying drawings, which, however, should not be taken to limit the disclosure to the specific examples, but are for explanation and understanding only.

In the following description, numerous details are discussed to provide a more thorough explanation of examples of the present disclosure. It will be apparent, however, to one skilled in the art, that examples of the present disclosure may be practiced without these specific details. In other instances, well-known structures and devices are shown in block diagram form, rather than in detail, to avoid obscuring examples of the present disclosure.

Note that in the corresponding drawings of the examples, signals are represented with lines. Some lines may be thicker, to indicate more constituent signal paths, and/or have arrows at one or more ends, to indicate primary information flow direction. Such indications are not intended to be limiting. Rather, the lines are used in connection with one or more examples to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a DAC 100 based on dynamic element matching (DEM). The mismatch shaping schemes based on DEM scheme includes binary-to-thermometer decoder 101, element selection circuit or element shuffling circuit 102, and thermometer encoded DAC 103. An N-bit digital input code Din is provided to binary-to-thermometer decoder 101, which converts the N-bit digital binary code to $2^N$ thermometer code. The binary-to-thermometer decoder 101 and element shuffling circuit 102 may have exponential complexity in terms of implementation since it requires a block of repeated circuitry for each of $2^N$ decoded signals, where N is the resolution. Element-shuffling circuit 102 can implement one of various types of element-shuffling schemes such as barrel shifting, tree-structured logic, or swappers. These schemes circularly rotate the connection from input to output based on the control bits of a memory element inside the block such as start pointer. The $2^N$ output of element-shuffling circuitry 102 is then provided to thermometer encoded DAC 103. The output of thermometer encoded DAC 103 is an analog signal Vout, which has mismatch errors shaped in frequency domain.

Figure 2:
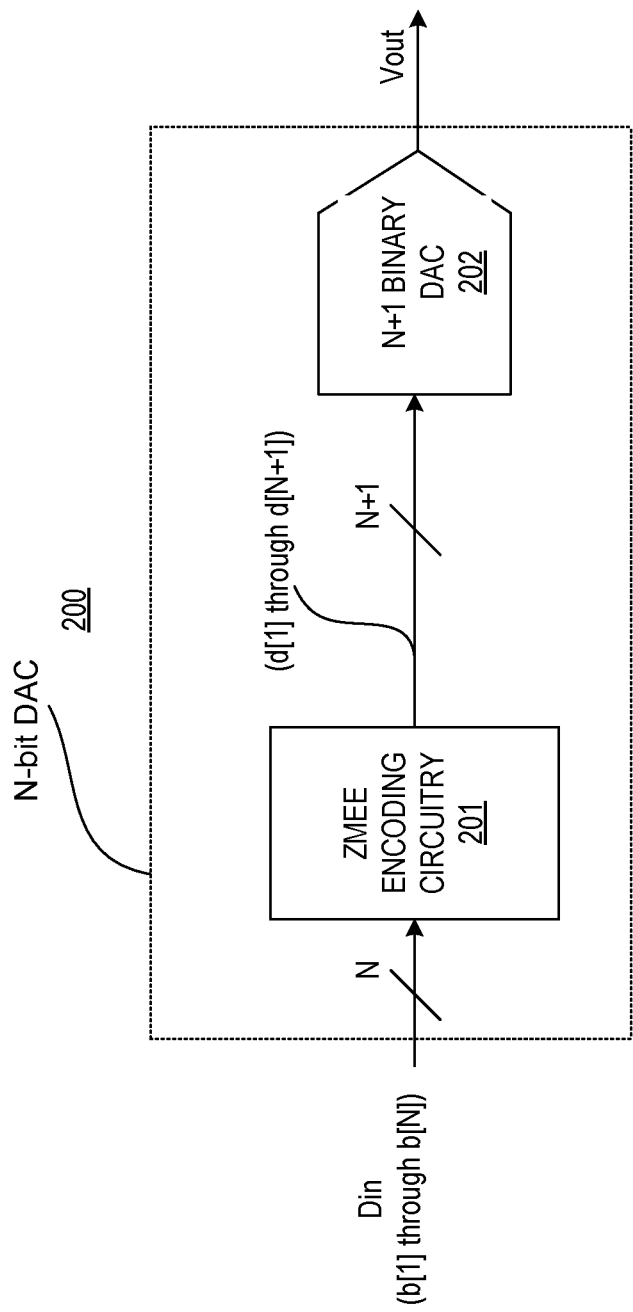
FIG. 2 is a schematic that illustrates a digital-to-analog converter that applies Zero Mean Error Encoding (ZMEE) scheme, in accordance with at least one example.

FIG. 2 illustrates a DAC 200 that applies a Zero Mean Error Encoding (ZMEE) scheme, in accordance with at least one example. In at least one example, DAC 200 is an N-bit DAC which comprises ZMEE encoding circuitry 201 and a binary DAC 202. In at least one example, the ZMEE scheme can be applied directly to binary weighted digital signal Din (e.g., b[1] through b[n]) by ZMEE encoding circuitry 201. The output d[1] through d[N+1] from ZMEE encoding circuitry 201 is then converted to analog signal Vout by binary DAC 202. As such, the output Vout of DAC 200 may have mismatch errors shaped in frequency domain. In at least one example, ZMEE encoding circuitry 201 applies a mismatch shaping technique. As discussed herein, the mismatch shaping technique is applied in DACs for high pass filtering mismatch related errors, in accordance with at least one example. In at least one example, the zero mean error encoding technique by ZMEE encoding circuitry 201 can be applied directly to binary coded signals, without the use for binary to thermometer decoding and element shuffling.

There are many technical effects of various examples. Some examples provide a simplified circuit technique that may not use a binary-to-thermometer decoder and an element shuffling circuitry for its mismatch shaping scheme. As such, the mismatch shaping scheme of some examples reduces implementation complexity from exponential to linear. Other technical effects will be evident from the various examples and figures.

Consider an N-bit binary DAC with mismatch errors $e_1$, $e_2$, . . . $e_N$. Without loss of generality, consider a unipolar DAC such that each binary weighted element of the unipolar DAC is used when its corresponding input bit is 1, and not used when it is 0. In at least one example, in a unipolar DAC when value of input b is 0 to $2^N−1$, it generates output voltage from 0 to $(2^N−1)*Vref/2^N$, where Vref is a reference voltage. In this case, the digital-to-analog conversion corresponds to how the binary value of a binary code is interpreted. Continuing with this example, when the input bit b is 0, that bit may not contribute its weight to the output (hence each DAC element is activated when the input bit is 1 and deactivated when the input bit is 0). There are other ways to design DAC such as bipolar DAC, where this assumption may not be true. In such a DAC, with mismatch errors, the error from a DAC element corresponding to bit 1 ($e_1$) may be present in the output when there is a 1 on that bit, and the cumulative error due to error $e_1$ will be proportional to running sum of number of 1s on bit 1.

In the ZMEE scheme to shape the mismatch errors $e_1$, in addition to normal interpretation of each input bit (e.g., normal encoding scheme), an alternating interpretation of each input bit is introduced. This alternating interpretation is referred to as an alternative encoding scheme. To cancel error $e_1$, whenever the cumulative error is positive, ZMEE encoding circuitry 201 uses an alternate encoding scheme such that errors introduced are $−e_1$, and vice versa, in accordance with at least one example. Such negative feedback causes the cumulative error to be bounded between $−e_1$ and $e_1$.

A similar approach can be applied to every other bit in the DAC, in accordance with at least one example. In at least one example, ZMEE encoding circuitry 201 chooses between normal and alternate encoding schemes based on the cumulative error. In at least one example, ZMEE encoding circuitry 201 controls when to select the normal or alternate encoding scheme for ZMEE encoding circuitry 201. In at least one example, ZMEE encoding circuitry 201 comprises an up/down counter, which controls the selection of normal or alternate encoding scheme. In at least one example, the up/down counter is a single bit up/down counter.

In at least one example, if it is ensured by the ZMEE scheme that there are on average equal number of normal and alternate encoding occurrences for bit 1 (e.g., b[1]), this may result in the cumulative error from bit 1 (e.g., b[1]) tending towards 0. Similarly, if the same technique is applied for all the bits, since digital code is linear superposition of individual bits, the total error on average may accumulate to zero. While the various examples are illustrated for a binary weighted DAC, the ZMEE scheme of various examples can be applicable to non-binary weighted DACs as well.

Figure 3:
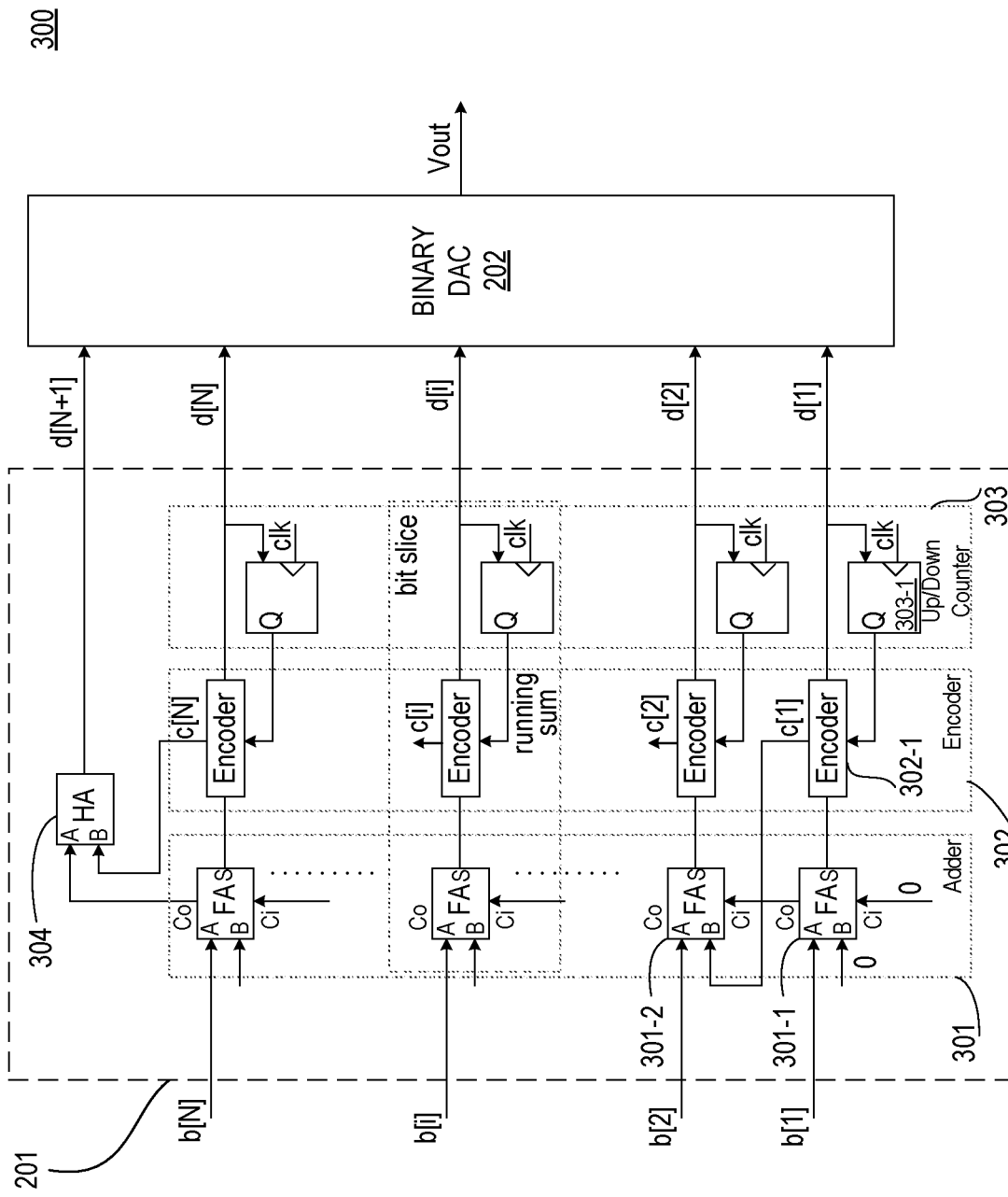
FIG. 3 is a schematic that illustrates a mismatch shaping scheme, in accordance with at least one example.

FIG. 3 is a schematic 300 of a mismatch shaping scheme, in accordance with at least one example. Schematic 300 is described with reference to FIG. 2. In at least one example, schematic 300 comprises an N-bit adder 301, an N-bit encoder 302, N single bit up/down counters 303, and half-adder (HA) 304. In at least one example, N-bit adder 301 is a multi-bit adder where an individual adder bit comprises a 1-bit full-adder (FA) such as FA 301-1 and FA 301-2. A 1-bit FA receives inputs A and B, and a carry-input (Ci) and generates an output sum bit and a carry-out (Co). Here, inputs A and B are being added. The carry-out of an FA is provided as carry-input to the subsequent FA, and so on. The output sum bit S from each FA is input to an encoder. In various examples, encoder 302 comprises a multi-bit encoder wherein an individual encoder per bit is coupled to an individual 1-bit full-adder. In at least one example, encoder 302 includes logic to apply normal encoding or an alternate encoding scheme based on an input signal (e.g., Q) generated by the up/down counter 303.

In at least one example, the output Q of an individual up-down counter 303 (e.g., 303-1) represents a cumulative error or running error introduced by each DAC element. In at least one example, if the cumulative error is 1, +e error has been introduced for that bit so far by the DAC. Continuing with this example, if the cumulative error is 0, −e error or 0 error has been so far introduced for that bit by the DAC. In at least one example, when the output Q of an individual up-down counter 303 (e.g., 303-1) is a 0, a corresponding individual encoder (e.g., 302-1) applies a normal encoding scheme. As a result of which, the up/down counter increments to 1 on the next clock clk cycle. In at least one example, when the output Q of an individual up-down counter 303 (e.g., 303-1) is a 1, a corresponding individual encoder (e.g., 302-1) applies an alternative encoding scheme. As a result of which, up/down counter 303 decrements to 0 on the next clock clk cycle. Hence, in various examples, a closed loop negative feedback is applied for each bit b such that running sum of positive and negative usage of the corresponding DAC element is kept as close to zero as possible.

In at least one example, as a result of choosing either normal or alternate encoding scheme, if encoder 302 produces an overflow such that there needs to be a carry or borrow from $(i+1)^{th}$ bit, the output C[i] of the encoder communicates that signal (carry or borrow) to $(i+1)^{th}$ full adder (e.g., one of the FA units in N-bit adder 301).

In at least one example, the ZMEE scheme can be applied directly to binary coded digital signals (e.g., b[1] through b[N]). In at least one example, the output d[1] through d[N+1] is then converted to an analog signal Vout. In the digital implementation, for an N-bit DAC, the ZMEE scheme can be decomposed into three functions: N-bit adder 301, N-bit encoder 302, and N single bit up/down counter 303. Due to the repetitive structure of the scheme, the implementation can be done for a single bit in a bit-slice, and then copied for the other bits to complete the overall implementation, in accordance with at least one example. In at least one example, in addition to the described blocks, HA 304 is used to capture the carry-out Co and overflow C[N] and to generate $(N+1)^{th}$ signal i.e., d[N+1]. In at least one example, the DAC may similarly contain (N+1) binary weighted elements (e.g., binary weighted capacitors or resistors).

The scheme of various examples is applicable to any DAC implementation. For example, ZMEE can be applied to R-2R ladder DAC, switched resistor DAC, switched current source DAC, switched capacitor DAC, interleaved DACs, etc. In at least one example, to enable the alternate encoding, tri-level (radix-3) encoding of DAC elements is applied that can be used in a positive sense or a negative sense, or not used at all. Such [1,0,−1] encoding scheme may be often used to remedy issues with inter-symbol interference (ISI) and to reduce DAC glitches. This results in radix-3 DAC and allows many alternate codes (redundancy) that result in the same digital value. Here, binary is Radix-2 and ternary is Radix-3. In binary, each bit can be either 0 or 1. In ternary each bit can be −1, 0 or 1. For example, in decimal, each bit can be 0-9 and in hexadecimal, each bit can be 0-9, A, B, C, D, E, and F.

FIG. 4 illustrates a table 400 showing an encoder's output for a sequence of "001" digital input code (e.g., b[1] through b[3]), in accordance with at least one example. While FIG. 4 illustrates a case of 3-bit DAC, the concept can be extrapolated to N-bit DAC. Consider here that input to a bipolar DAC is [1,−1] binary coded. Then to analyze the effect of having a 1 on the LSB bit, consider a sequence of [0,0,1] code, which implies LSB is 1 and rest of the bits are not under consideration and hence set to 0. This allows for analyzing the effect of each bit in isolation. Such a sequence of "10" digital input codes may be encoded in a manner as shown in FIG. 4.

As shown, at the end of $8^{th}$ cycle, the cumulative error introduced by all the elements is zero, except that from $(N+1)^{th}$ element. The pattern repeats itself after $8^{th}$ cycle. Since the cumulative sum tends to zero, the average value also must tend to zero, and hence any error at DC and low frequencies may be cancelled. Since the sequence of eight is on LSB introduces one $e_4$ error, an individual LSB bit introduces an $e_4/8$ error residual. Similarly, LSB+1 bit introduces $\frac{1}{4}^{th}$ of the $e_4$ error residual, and so forth. Hence, the residual errors are the properly weighted sum of the error $e_4$. Then, on average, the output of the DAC becomes:

$$\bar{A} = W_I \times \bar{D} + \left[ \frac{e_4}{2} \quad \frac{e_4}{4} \quad \frac{e_4}{8} \right] \times \bar{D} = (1 + e_4) W_I \times \bar{D}$$

Here, $$W_I = \left[ \frac{1}{2} \quad \frac{1}{4} \quad \frac{1}{8} \right]$$

is the ideal weight vector and $\bar{D}$ is a row vector indicating average value of input digital code. Such residual error translates to gain error for DC and low frequency input signals. For most applications, such error may be unimportant and can be ignored. An illustrative analysis can be performed to investigate the cumulative error for a triangular wave input sequence.

Figure 5:
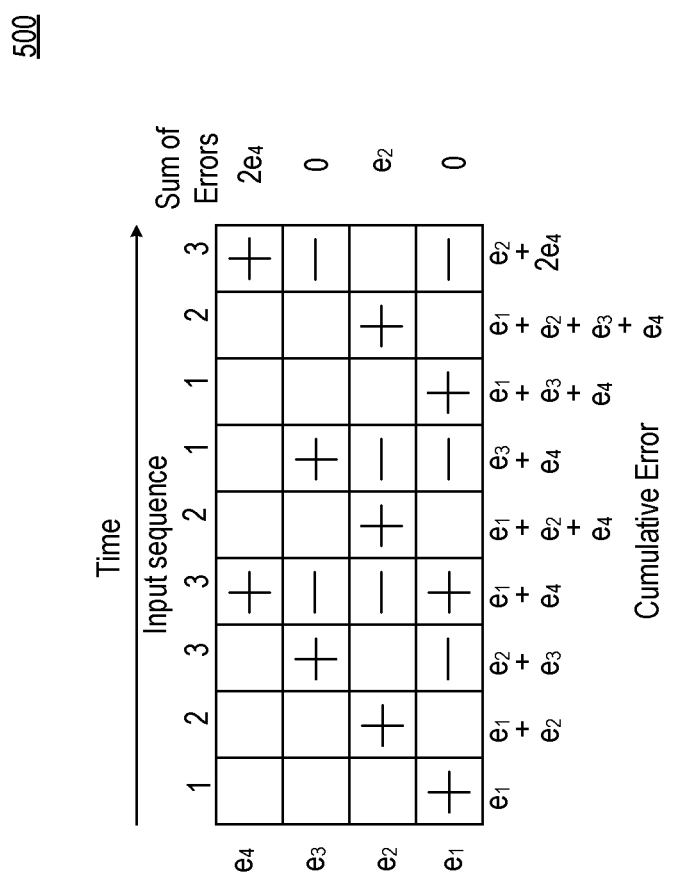
FIG. 5 illustrates a table showing accumulation of mismatch error for a triangular wave input digital code.

FIG. 5 illustrates a table 500 showing accumulation of mismatch error for a triangular wave input digital code sequence of [1, 2, 3, 3, 2, 1, 1, 2, 3], according to at least one example. At the end of 9 clock cycles, the residual error is $e_2+2e_4$. As shown before, the error e 4 becomes gain error. The residual error $e_2$ appears as there is odd number of usages of the bit 2 element. However, due to negative feedback, the next usage will be with the alternate encoding scheme, and hence will cancel this error. Thus, on average for many cycles, the cumulative error may tend to zero, and hence the mismatch error spectrum may be shaped. Unlike in DEM, although the number of times all the elements are used is not the same, the mismatch related error can still be shaped. This is due to the independent cancellation of errors from each individual binary weighted DAC element, which in turn is due to equal positive and negative usages of each binary weighted DAC element.

FIG. 6A illustrates a pseudocode 600 of a Zero Mean Error Encoding (ZMEE) scheme, in accordance with at least one example. In at least one example, some statements of pseudocode 600 are performed by ZMEE encoding circuitry 201. In at least one example, a circuit implementation (e.g., synthesized logic) of pseudocode 600 is implemented by one of the bit-slice of ZMEE encoding circuitry 201 (e.g., by encoder 302-1). Here, pseudocode 600 is for a bipolar digital signal such that 1 represents +1 and 0 represents −1. Here, B is an N-bit radix-2 binary input digital code, E is an N-bit binary cumulative error vector, C is an N-bit radix-3 internal vector, and D is a (N+1)-bit radix-3 ZMEE output code. C and D can have values [−1,0,1] in each bit. For each $k^{th}$ bit, if the cumulative error is greater than 0 and a +1 is to be encoded, an alternate encoding scheme is chosen such that $k^{th}$ bit is −1 and $(k+1)^{th}$ overflow bit (C[k+1]) is +1. Also, if the cumulative error is less than or equal to 0 and a −1 is to be encoded, an normal encoding scheme is chosen such that $k^{th}$ bit is +1 and $(k+1)^{th}$ overflow bit (C[k+1]) is −1. This negative feedback ensures that E is bounded within [0,+1]. Therefore, E can be stored in a single flip-flop per bit.

Figure 6B:
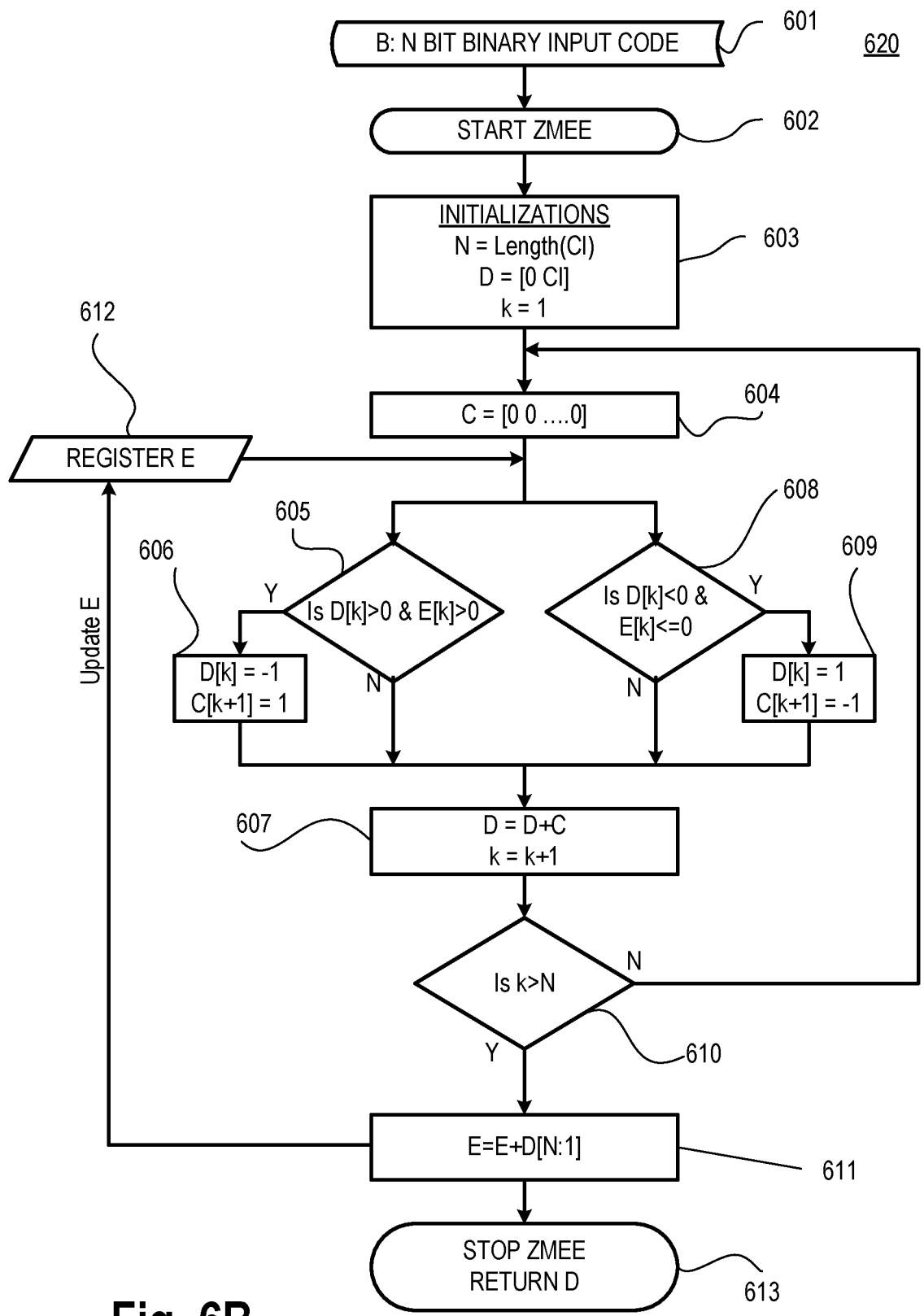
FIG. 6B illustrates a flowchart of the ZMEE scheme, in accordance with at least one example.

FIG. 6B illustrates a flowchart 620 of the ZMEE scheme, in accordance with at least one example. Various blocks of the flowchart 620 can be performed by hardware, software, firmware, or a combination of them. While various blocks are shown in a particular order, the order can be modified. For example, some blocks may be performed in parallel. In at least one example, some blocks of flowcharts 620 are performed by ZMEE encoding circuitry 201. For example, a circuit implementation (e.g., synthesized logic) of flowchart 620 is implemented by a bit-slice of ZMEE encoding circuitry 201 (e.g., encoder 302-1).

The method of flowchart 620 comprises receiving an n-bit binary input. This n-bit binary input is encoded to generate an encoded n+1 bit ternary output. In at least one example, this encoded n+1 ternary output is provided to a digital-to-analog converter (e.g., DAC 202), wherein the encoded n+1 ternary output shapes mismatch errors in DAC 202. In at least one example, the method comprises selecting a normal encoding scheme or an alternate encoding scheme by the $i^{th}$ encoder, wherein a value of a first output (c[i]) of the $i^{th}$ encoder depends on whether the normal encoding scheme or the alternate encoding scheme is selected.

In at least one example, the method comprises adding a 1 to a $(i+1)^{th}$ binary input bit when the alternate encoding scheme is selected. In this case, a second output (d[i]) of the $i^{th}$ encoder to is set to −1. In at least one example, the second output is sampled by a clock to generate a sampled second output, wherein the second output is received by DAC 202. In at least one example, the method comprises subtracting a −1 to a $(i+1)^{th}$ binary input bit when the normal encoding scheme is selected. In this case, the second output of the $i^{th}$ encoder is set to 1. In at least one example, the second output is sampled by the clock clk to generate a sampled second output Q, wherein the second output is received by DAC 202. This basic framework is described in flowchart 620, according to one example.

Flowchart 620 is another view of pseudocode 600. At block 601, N-bit binary code B is provided to a DAC (e.g., DAC 200). At block 602, the ZMEE scheme begins, which covers the remaining operational blocks. At block 603, variables N, D, and k are initialized. These initial values may be stored in registers, which may be accessible by encoder 302. Here, N is the length of the input binary code (e.g., number of bits). Here, D is an N+1 code comprising an additional bit of value 0 and input B. D later provides the output N+1 code of the ZMEE scheme to DAC 202. Here, k is a counter value to progress through bits of D from LSB to MSB, where LSB is index 1 and MSB is index N. At block 604, a null vector C is established.

At block 605, in at least one example, a determination is made about whether D(k) is greater than zero and whether the cumulative error E per bit is greater than zero. For example, if D(k) is greater than zero and E(k) is greater than 0, then D(k) is assigned −1 and the next bit value of C is assigned 1 (i.e., C(k+1) is 1) as indicated by block 606.

At block 608, in at least one example, a determination is made about whether a D(k) is less than zero and whether the cumulative error E per bit is less than or equal to zero. For example, if D(k) is less than zero and E(k) is equal to zero or less than zero, then D(k) is assigned 1 and the next bit value of C is assigned −1 (i.e., C(k+1) is −1) as indicated by block 609.

In at least one example, after either execution of block 606 or block 609 or skipping both blocks, the process proceeds to block 607, where C is added to D. Note, the cumulative error E(k) also referred to as a running error is the output of a counter (or sequential circuit or flip-flop) associated with the output bit D(k). This cumulative error E(k) is received by the encoder associated with the input bit B(k).

At block 610, in at least one example, the value of k is compared with the total number of input bits N. If k is less than N, the process iterates and starts at block 604. In at least one example, If k is equal to N, then the cumulative error is updated as a sum of previous cumulative error and D, as indicated by block 611. The cumulative error E is then stored in a register at block 612, in accordance with at least one example. At block 611, in at least one example, the output code D is returned, which is then provided to binary DAC 202 as input, as indicated by block 613.

In at least one example, some, or all parts of pseudocode 600 and flowchart 620 are stored as computer or machine-executable instructions stored in a machine-readable storage medium. These instructions, when executed by a processor or machine, may cause the performance of the ZMEE scheme of various examples.

Figure 6C:
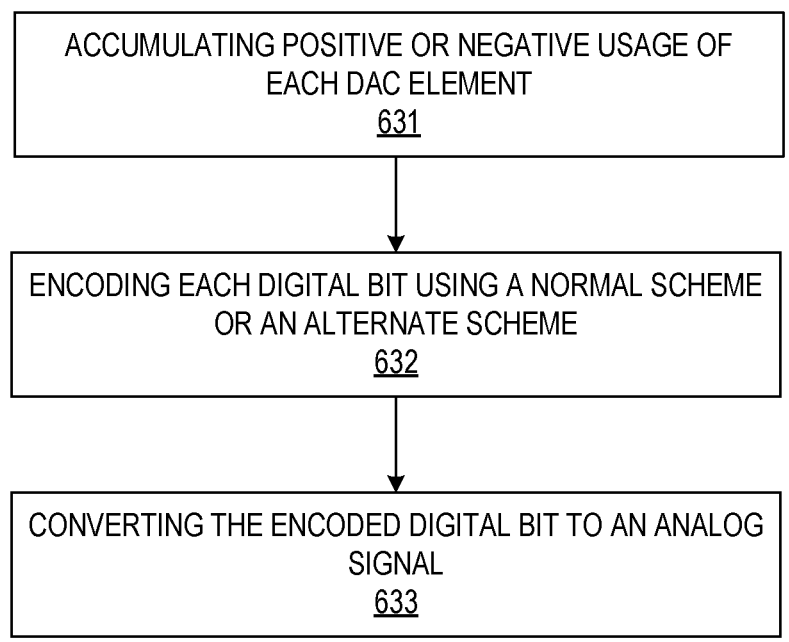
FIG. 6C illustrates a flowchart of a method for converting an N-bit binary coded input digital signal into an analog output signal, in accordance with at least one example.

FIG. 6C illustrates a flowchart 630 of a method for converting an N-bit binary coded input digital signal into an analog output signal, in accordance with at least one example. Various blocks of the flowchart 620 can be performed by hardware, software, firmware, or a combination of them. While various blocks are shown in a particular order, the order can be modified. Flowchart 630 is a simplified version of flowchart 620. The N-bit binary coded input digital signal includes individual input bits.

At block 631, in at least one example, positive or negative usage associated with each digital-to-analog converter element is accumulated or stored. At block 632, in at least one example, an individual digital input bit is encoded using a normal scheme or an alternate scheme depending on the accumulated positive or negative usage, such that through negative feedback, an accumulated error contributed from the individual digital input bit is bounded close to zero. In at least one example, an encoding scheme for each input bit is selected based on an accumulated digital value or error to reduce the accumulated digital value or error to zero. In at least one example, accumulated digital value is stored in a plurality of sequential units (e.g., flip-flops). Note, here for a bipolar input digital signal, input bit 1 represents +1 and input bit 0 represents −1. For instance, the input digital signal is binary coded while the encoded output is ternary coded. In at least one example, the normal encoding scheme is applied when the individual digital bit is 1 and the accumulated error is 0, and the alternate encoding scheme is applied when the individual digital bit is −1 and the accumulated error is 1.

In at least one example, the method comprises adding a carry or borrow signal to a next higher bit of the N-bit binary coded input digital signal. For example, an overflow bit value or an underflow bit value from a particular input bit is added to the next higher input bit. In at least one example, a final overflow or underflow bit value is calculated, and the final digital output (or encoded output) is calculated for input to a DAC. Here, the encoded digital signal can be −1, 0, or +1 and the carry or borrow signal can also be −1, 0, or +1. In at least one example, the method of accumulating the positive or negative usage is performed by an N 1-bit up/down counter.

At block 633, in at least one example, the encoded digital bit is converted to an analog signal using an (N+1)-bit binary weighted DAC. For instance, the individual encoded digital bit is provided to an (N+1)-bit binary weighted digital-to-analog converter which converts the N-bit binary coded input digital signal into the analog output signal, wherein the (N+1)-bit binary weighted digital-to-analog converter includes the individual digital-to-analog converter element. Here, each encoded digital bit is applied to a DAC such that mismatch errors in the DAC are shaped in frequency domain.

Figure 6D:
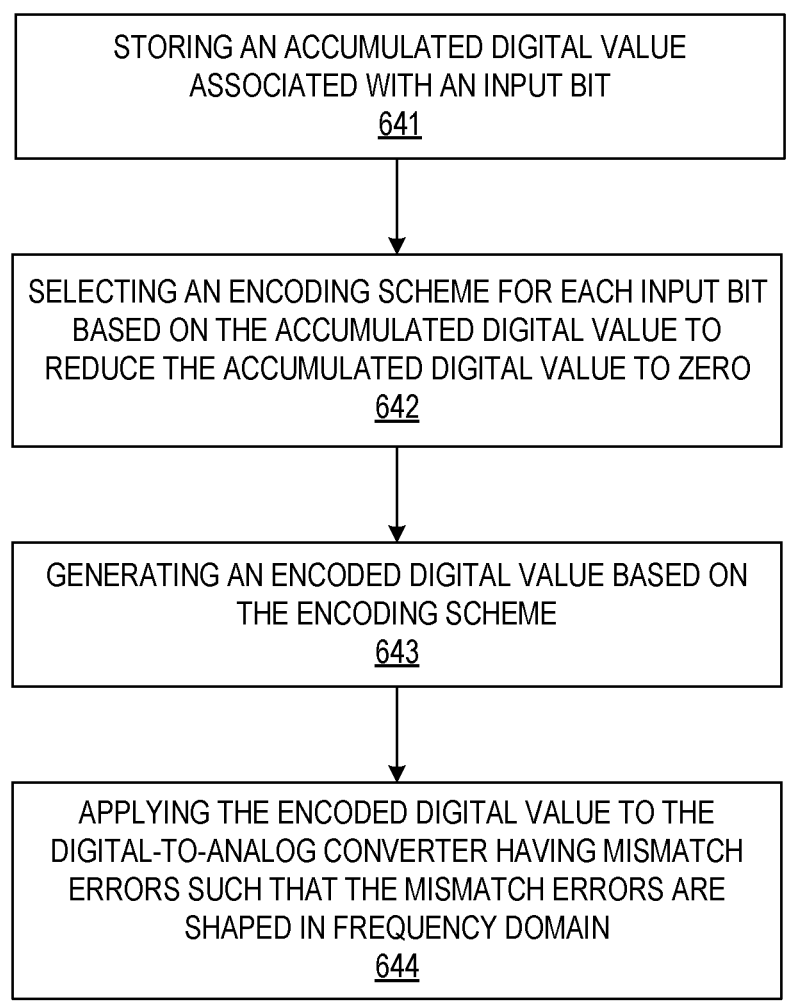
FIG. 6D illustrates a flowchart of a method for shaping mismatch errors in a digital-to-analog converter, in accordance with at least one example.

FIG. 6D illustrates a flowchart 640 of a method for shaping mismatch errors in a digital-to-analog converter, in accordance with at least one example. Various blocks of the flowchart 640 can be performed by hardware, software, firmware, or a combination of them. While various blocks are shown in a particular order, the order can be modified. Flowchart 640 is a simplified version of flowchart 620.

At block 641, in at least one example, an accumulated digital value associated with an input bit is stored. At block 642, in at least one example, an encoding scheme is selected for each input bit based on the accumulated digital value to reduce the accumulated digital value to zero. At block 643, in at least one example, an encoded digital value is generated based on the encoding scheme. At block 644, in at least one example, the encoded digital value is applied to the digital-to-analog converter having mismatch errors such that the mismatch errors are shaped in frequency domain. In at least one example, the method comprises adding an overflow or an underflow from the input bit to a next higher bit. In at least one example, the method comprises calculating a final overflow or underflow and computing an additional digital output. In at least one example, the input bit is part of a binary coded input signal, wherein the encoded digital value is ternary coded.

Figure 7:
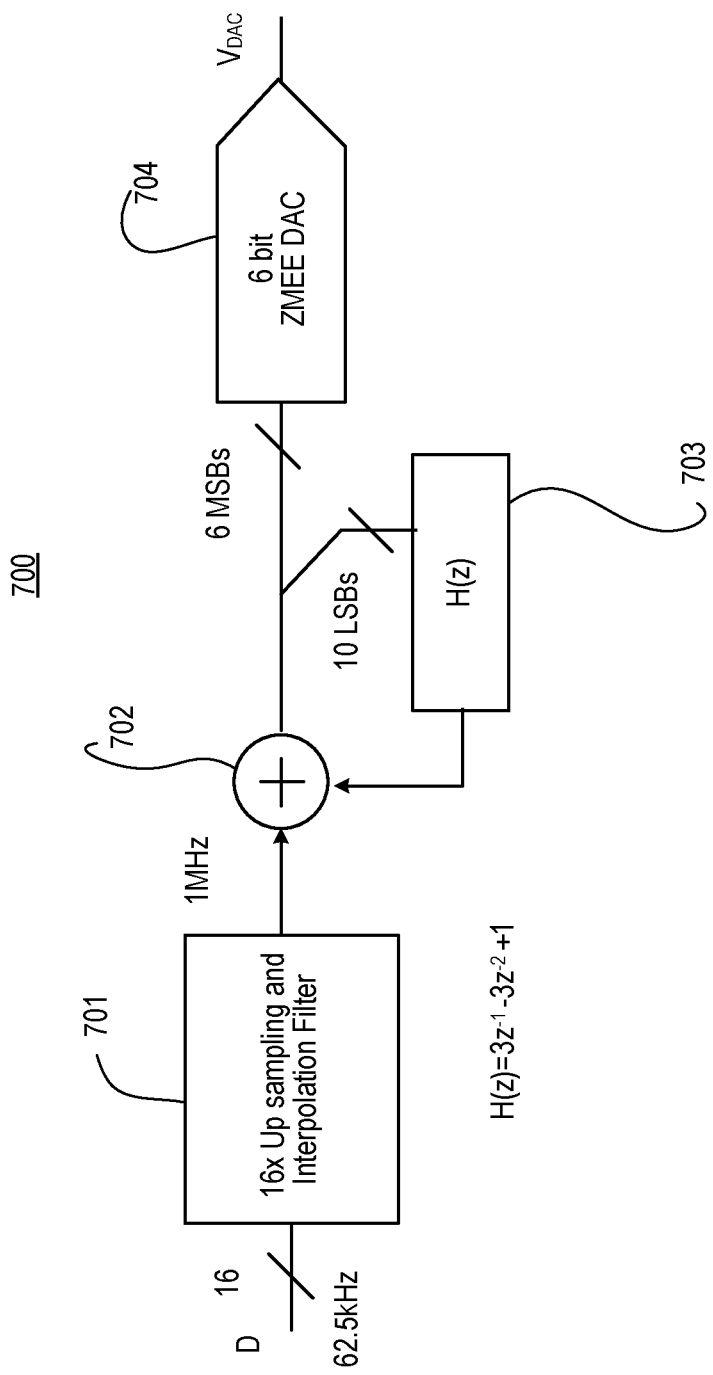
FIG. 7 illustrates a model of a delta-sigma DAC using the ZMEE scheme, in accordance with at least one example.

FIG. 7 illustrates a delta-sigma DAC 700 which uses the ZMEE DAC 704, in accordance with at least one example. In at least one example, encoder 302 can be synthesized as a standard synthesis design flow. In at least one example, delta-sigma DAC 700 comprises interpolation filter 701, summing node 702, loop filter 703, and ZMEE DAC 704 coupled as shown. Here, ZMEE DAC 704 is like DAC 200.

Figure 8:
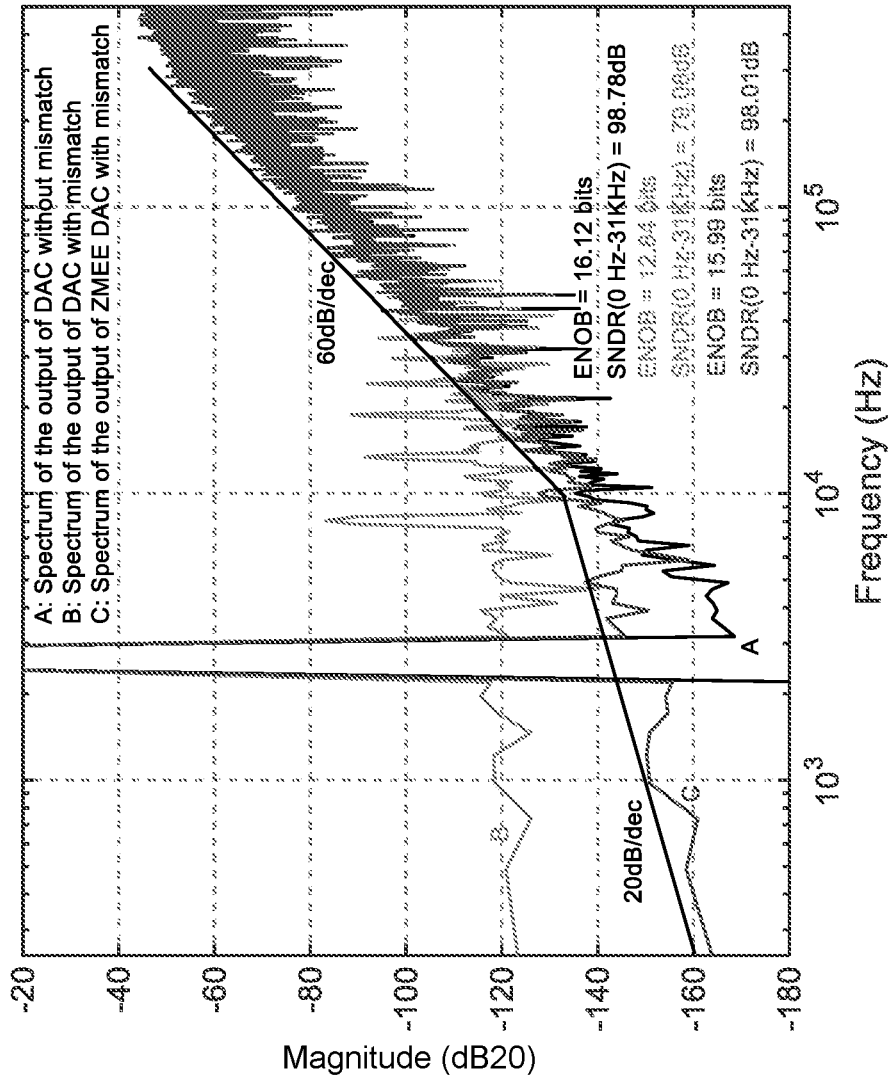
FIG. 8 illustrates a plot showing output spectrum using the ZMEE scheme, in accordance with at least one example.

FIG. 8 illustrates a plot 800 showing output spectrum using the ZMEE scheme, in accordance with at least one example. Plot 800 illustrates the results of simulating the ZMEE scheme in the delta-sigma DAC with 1% element mismatch. Spectrum A represents the spectrum of the DAC output without including mismatch errors. Spectrum B represents the spectrum of the DAC output with 1% element mismatch and spectrum C represents the spectrum of the DAC output with 1% mismatch and ZMEE scheme applied. The output spectrum contains truncation noise shaped by the $3^{rd}$ order digital loop, and mismatch noise. In the ideal DAC case, the truncation noise rolls off at −60 dB/dec and there is no mismatch noise. In the DAC with 1% mismatch, the truncation noise rolls off at −60 dB/dec up to about 20 kHz, where the mismatch errors start dominating and flat noise spectrum with harmonic spurs are shown. In the DAC with 1% mismatch and ZMEE scheme, below 10 kHz the shaped mismatch noise starts to dominate and hence the spectrum starts to roll off at −20 dB/dec as expected. Hence, the proposed scheme shapes mismatch errors in frequency domain by first order. The ZMEE scheme can be implemented in MATLAB as per the pseudocode in FIG. 6A or flowchart of FIG. 6B.

FIG. 9 illustrates a computer device 900 (also referred to as a computer system) with a DAC using the ZMEE scheme, in accordance with at least one example. In at least one example, computing device 900 represents an appropriate computing device, such as a computing tablet, a mobile phone or smart-phone, a laptop, a desktop, an Internet-of-Things (TOT) device, a server, a set-top box, a wireless-enabled e-reader, or the like. It will be understood that certain components are shown generally, and not all components of such a device are shown in computing device 900. Any of the blocks described herein can include a DAC using the ZMEE scheme, in accordance with various examples.

In at least one example, computing device 900 includes processor 910. The various examples of the present disclosure may also comprise a network interface within 970 such as a wireless interface so that a system example may be incorporated into a wireless device, for example, cell phone or personal digital assistant.

In at least one example, processor 910 can be an integrated circuit which can include one or more physical devices, such as microprocessors, application processors, microcontrollers, programmable logic devices, or other processing means. In at least one example, processing operations performed by processor 910 include the execution of an operating platform or operating system on which applications and/or device functions are executed. In at least one example, processing operations include operations related to I/O (input/output) with a human user or with other devices, operations related to power management, and/or operations related to connecting the computing device 900 to another device. In at least one example, processing operations may also include operations related to audio I/O and/or display I/O.

In at least one example, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. In at least one example, devices for such functions can be integrated into computing device 900 or connected to the computing device 900. In at least one example, a user interacts with the computing device 900 by providing audio commands that are received and processed by processor 910.

Display subsystem 930 represents hardware (e.g., display devices) and software (e.g., drivers) components that provide a visual and/or tactile display for a user to interact with the computing device 900. Display subsystem 930 includes display interface 932, which includes the particular screen or hardware device used to provide a display to a user. In at least one example, display interface 932 includes logic separate from processor 910 to perform at least some processing related to the display. In at least one example, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to, display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In at least one example, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In at least one example, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of various examples are also provided as a machine-readable storage medium (e.g., memory subsystem 960) for storing the computer-executable instructions (e.g., instructions to implement any other processes discussed herein). In at least one example, the machine-readable storage medium (e.g., memory subsystem 960) may include, but is not limited to, flash memory, optical disks, CD-ROMs, DVD ROMs, RAMs, EPROMs, EEPROMs, magnetic or optical cards, phase change memory (PCM), or other types of machine-readable storage media suitable for storing electronic or computer-executable instructions. Examples of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 970 includes hardware devices (e.g., wireless and/or wired connectors and communication hardware) and software components (e.g., drivers, protocol stacks) to enable the computing device 900 to communicate with external devices. In at least one example, computing device 900 could be separate devices, such as other computing devices, wireless access points or base stations, as well as peripherals such as headsets, printers, or other devices.

Connectivity 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via LTE (long term evolution), LTE 4G, LTE 5G, GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as LTE), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High-Definition Multimedia Interface (HDMI), Firewire, USB Type-C, or other types.

Throughout the specification, and in the claims, the term "connected" means a direct connection, such as electrical, mechanical, or magnetic connection between the things that are connected, without any intermediary devices.

Here, "coupled" means a direct or indirect connection, such as a direct electrical, mechanical, or magnetic connection between the things that are connected or an indirect connection, through one or more passive or active intermediary devices.

Here, "adjacent" generally refers to a position of a thing being next to (e.g., immediately next to or close to with one or more things between them) or adjoining another thing (e.g., abutting it).

Here, "circuit" or "module" may refer to one or more passive and/or active components or software code that are arranged to cooperate with one another to provide a desired function.

Here, "signal" may refer to at least one current signal, voltage signal, magnetic signal, or data/clock signal. The meaning of "a," "an," and "the" include plural references. The meaning of "in" includes "in" and "on."

Here, "analog signal" refers to any continuous signal for which the time varying feature (variable) of the signal is a representation of some other time varying quantity, i.e., analogous to another time varying signal.

Here, "digital signal" refers to a physical signal that is a representation of a sequence of discrete values (a quantified discrete-time signal), for example of an arbitrary bit stream, or of a digitized (sampled and analog-to-digital converted) analog signal.

Here, "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Here, "left," "right," "front," "back," "top," "bottom," "over," "under," and the like in the description and in the claims, if any, are used for descriptive purposes and not necessarily for describing permanent relative positions.

Reference in the specification to "an example," "one example," "some examples," or "other examples" means that a particular feature, structure, or characteristic described in connection with the examples is included in at least some examples, but not necessarily all examples. The various appearances of "an example," "one example," or "some examples" are not necessarily all referring to the same examples. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more examples. For example, a first example may be combined with a second example anywhere the particular features, structures, functions, or characteristics associated with the two examples are not mutually exclusive.

While the disclosure has been described in conjunction with specific examples thereof, many alternatives, modifications and variations of such examples will be apparent to those of ordinary skill in the art considering the foregoing description. The examples of the disclosure are intended to embrace all such alternatives, modifications, and variations as to fall within the broad scope of the appended claims. Where specific details are set forth to describe examples of the disclosure, it should be apparent to one skilled in the art that the disclosure can be practiced without, or with variation of, these specific details. The description is thus to be regarded as illustrative instead of limiting. The structures of at least one example described herein can also be described as method(s) of forming those structures or apparatuses, and method(s) of operation of these structures or apparatuses. In at least one example, the method may be an iterative method.

Following are additional examples provided in view of the above-described implementations. Here, one or more features of example, in isolation or in combination, can be combined with one or more features of one or more other examples to form further examples also falling within the scope of the disclosure. As such, one implementation can be combined with one or more other implementation without changing the scope of disclosure.

Example 1 is an apparatus comprising: a mismatch shaping circuitry to receive an N-bit binary input bits and to generate an N+1 digital output; and a digital-to-analog converter to receive the N+1 bit digital output and to generate an analog output, wherein the mismatch shaping circuitry is to encode the N+1 bit digital output to shape mismatch errors in the digital-to-analog converter.

Example 2 is an apparatus of any example herein, particularly example 1, wherein the mismatch shaping circuitry comprises: N 1-bit full adders, wherein an individual 1-bit full adder is to receive an individual binary input bit from the N-bit binary input bits; a half adder coupled to an $N^{th}$ 1-bit full adder and to an $N^{th}$ encoder; N encoders; and N sequential circuits, wherein an individual encoder is coupled to the individual 1-bit full adder and an individual sequential circuit.

Example 3 is an apparatus of any example herein, particularly example 2, wherein the N encoders include an $i^{th}$ encoder, wherein the N 1-bit full adders include an i+1 1-bit full adder, and wherein a first output of the $i^{th}$ encoder is received by an input of the i+1 1-bit full adder.

Example 4 is an apparatus of any example herein, particularly example 3 further wherein an $i^{th}$ encoder is to select a normal encoding scheme or an alternate encoding scheme based on an output of an $i^{th}$ sequential circuit, wherein a value of the first output depends on whether the $i^{th}$ encoder selects the normal encoding scheme or the alternate encoding scheme.

Example 5 is an apparatus of any example herein, particularly example 4, wherein the i+1 1-bit full adder is to add 1 to a i+1 digital input bit when the alternate encoding scheme is selected by the $i^{th}$ encoder, wherein the $i^{th}$ encoder is to set a second output of the $i^{th}$ encoder to −1, wherein the n sequential circuits includes the $i^{th}$ sequential circuit, wherein the second output is received by the digital-to-analog converter and an input of the $i^{th}$ sequential circuit.

Example 6 is an apparatus of any example herein, particularly example 5, wherein an output of the $i^{th}$ sequential circuit indicates a cumulative error associated with an $i^{th}$ digital output bit of the N-bit digital output, wherein the output of the $i^{th}$ sequential circuit is monitored and received by the $i^{th}$ encoder.

Example 7 is an apparatus of any example herein, particularly example 4, wherein the i+1 1-bit full adder is to add 0 to a $(i+1)^{th}$ digital input bit when the normal encoding scheme is selected by the $i^{th}$ encoder, wherein the $i^{th}$ encoder is to set a second output of the $i^{th}$ encoder to 1, wherein the n sequential circuits includes the $i^{th}$ sequential circuit, wherein the second output is received by the digital-to-analog converter and an input of the $i^{th}$ sequential circuit.

Example 8 is an apparatus of any example herein, particularly example 6, wherein the digital-to-analog converter includes a plurality of elements, wherein an individual element includes a capacitor or a resistor, wherein the mismatch errors are from the plurality of elements.

Example 9 a method comprising: receiving an N-bit digital input; encoding the N-bit digital input to generate an encoded N+1 bit digital output; and providing the encoded N+1 bit digital output to a digital-to-analog converter, wherein the encoded N+1 digital output is to shape mismatch errors in the digital-to-analog converter.

Example 10 is a method of any example herein, particularly example 9 further comprising: selecting a normal encoding scheme or an alternate encoding scheme for an $i^{th}$ encoder, wherein a value of a first output and second output of the $i^{th}$ encoder depends on whether the normal encoding scheme or the alternate encoding scheme is used.

Example 11 is a method of any example herein, particularly example 10 further comprising: adding a 1 to a i+1 digital input bit when the alternate encoding scheme is selected; setting a second output of the $i^{th}$ encoder to −1; and sampling the second output by a clock to generate a sampled second output, wherein the second output is received by the digital-to-analog converter.

Example 12 is a method of any example herein, particularly example 10 further comprising: adding a 0 to a i+1 digital input bit when the normal encoding scheme is selected; setting a second output of the $i^{th}$ encoder to 1; and sampling the second output by a clock to generate a sampled second output, wherein the second output is received by the digital-to-analog converter.

Example 13 is an apparatus comprising: means for receiving an N-bit binary input; means for encoding the N-bit binary input to generate an encoded N+1 bit digital output; and means for providing the encoded N+1 bit digital output to a digital-to-analog converter, wherein the encoded N+1 bit digital output is to shape mismatch errors in the digital-to-analog converter.

Example 14 is an apparatus of any example herein, particularly example 13 further comprising: means for selecting a normal encoding scheme or an alternate encoding scheme for an $i^{th}$ encoder, wherein a value of a first output of the $i^{th}$ encoder depends on whether the normal encoding scheme or the alternate encoding scheme.

Example 15 is an apparatus of any example herein, particularly example 14 further comprising: means for adding a 1 to a i+1 binary input bit when the alternate encoding scheme is selected; means for setting a second output of the $i^{th}$ encoder to −1; and means for sampling the second output by a clock to generate a sampled second output, wherein the second output is received by the digital-to-analog converter.

Example 16 is an apparatus of any example herein, particularly example 15 further comprising: means for adding a 0 to a i+1 binary input bit when the normal encoding scheme is selected; means for setting a second output of the $i^{th}$ encoder to 1; and means for sampling the second output by a clock to generate a sampled second output, wherein the second output is received by the digital-to-analog converter.

Example 17 is a method for converting a N-bit binary coded input digital signal into an analog output signal, the method comprising: accumulating a positive or negative usage of an individual digital-to-analog converter element; encoding an individual digital bit, of the N-bit binary coded input digital signal, with a normal scheme or an alternate scheme depending on the accumulated positive or negative usage, such that through negative feedback, an accumulated error contributed from the individual digital bit is bounded close to zero; and providing the individual encoded digital bit to an (N+1)-bit binary weighted digital-to-analog converter which converts the (N+1)-bit digital signal into the analog output signal, wherein the (N+1)-bit binary weighted digital-to-analog converter includes the individual digital-to-analog converter element.

Example 18 is a method of any example herein, particularly example claim 17, wherein the normal encoding scheme is applied when the individual digital bit is 1 and the accumulated error is 0, and wherein the alternate encoding scheme is applied when the individual digital bit is −1 and the accumulated error is 1.

Example 19 is a method of any example herein, particularly example 17, further comprising adding a carry or borrow signal to a next higher bit of the N-bit binary coded input digital signal.

Example 20 is a method of any example herein, particularly example 19, wherein encoding the individual digital bit is to result in an individual encoded digital bit, wherein the individual encoded digital bit is one of −1, 0, +1, and wherein the carry or borrow signal is one of −1, 0, or +1.

Example 21 is a method of any example herein, particularly example 20, wherein accumulating the positive or negative usage is performed by an N 1-bit up/down counter.

Example 22 is a method for shaping mismatch errors in a digital-to-analog converter, the method comprising: storing an accumulated digital value associated with an output bit; selecting an encoding scheme for each input bit based on the accumulated digital value to reduce the accumulated digital value to zero; generating an encoded digital value based on the encoding scheme; and applying the encoded digital value to the digital-to-analog converter having mismatch errors such that the mismatch errors are shaped in frequency domain.

Example 23 is a method of any example herein, particularly example 22 further comprising: adding an overflow or an underflow from the input bit to a next higher bit; and calculating a final overflow or underflow and computing an additional digital output.

Example 24 is a method of any example herein, particularly example 23, wherein the input bit is part of a binary coded input signal, wherein the encoded digital value is ternary coded.

Example 25 is a system comprising: a memory circuitry to store one or more instructions; a processor circuitry coupled to the memory circuitry, wherein the processor circuitry is to execute the one or more instructions; and a communication interface to allow the processor circuitry to communicate with another device, wherein the processor circuitry includes a sigma-delta digital-to-analog converter which comprises: a mismatch shaping circuitry to receive an N-bit binary input bits and to generate an N+1 digital output; and a digital-to-analog converter to receive the N+1 digital output and to generate an analog output, wherein the mismatching shaping circuitry is to encode the N+1 digital output to shape errors in the digital-to-analog converter.

Example 26 is a system of any example herein, particularly example 25, wherein the sigma-delta digital-to-analog converter is according to any one of apparatus examples 2 to 8.

Example 27 is a machine-readable storage media having machine-readable instructions stored thereon that when executed cause one or more machines to perform a method, wherein the method is according to any one of method examples 9 to 12.

Example 28 is a machine-readable storage media having machine-readable instructions stored thereon that when executed cause one or more machines to perform a method, wherein the method is according to any one of method examples 17 to 21.

Example 29 is a machine-readable storage media having machine-readable instructions stored thereon that when executed cause one or more machines to perform a method, wherein the method is according to any one of method examples 22 to 24.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate example.

We claim:

1. An apparatus comprising:
   a mismatch shaping circuitry to receive an N-bit binary input bits and to generate an (N+1)-bit digital output; and
   a digital-to-analog converter to receive the (N+1)-bit digital output and to generate an analog output, wherein the mismatch shaping circuitry is to encode the (N+1)-bit digital output to shape mismatch errors in the digital-to-analog converter.

2. The apparatus of claim 1, wherein the mismatch shaping circuitry comprises:
   N 1-bit full adders, wherein an individual 1-bit full adder is to receive an individual binary input bit from the N-bit binary input bits;
   a half adder coupled to an $N^{th}$ 1-bit full adder and to an $N^{th}$ encoder;
   N encoders; and
   N sequential circuits, wherein an individual encoder is coupled to the individual 1-bit full adder and an individual sequential circuit.

3. The apparatus of claim 2, wherein the N encoders include an $i^{th}$ encoder, wherein the N 1-bit full adders include an i+1 1-bit full adder, and wherein a first output of the $i^{th}$ encoder is received by an input of the i+1 1-bit full adder.

4. The apparatus of claim 3 further wherein the $i^{th}$ encoder is to select a normal encoding scheme or an alternate encoding scheme based on an output of an $i^{th}$ sequential circuit, and wherein a value of the first output depends on whether the $i^{th}$ encoder selects the normal encoding scheme or the alternate encoding scheme.

5. The apparatus of claim 4, wherein the i+1 1-bit full adder is to add 1 to a i+1 digital input bit when the alternate encoding scheme is selected by the $i^{th}$ encoder, wherein the $i^{th}$ encoder is to set a second output of the $i^{th}$ encoder to −1, wherein the n sequential circuits includes the $i^{th}$ sequential circuit, and wherein the second output is received by the digital-to-analog converter and an input of the $i^{th}$ sequential circuit.

6. The apparatus of claim 5, wherein the output of the $i^{th}$ sequential circuit indicates a cumulative error associated with an $i^{th}$ digital output bit of an N-bit digital output of the (N+1)-bit digital output, and wherein the output of the $i^{th}$ sequential circuit is monitored and received by the $i^{th}$ encoder.

7. The apparatus of claim 4, wherein the i+1 1-bit full adder is to add 0 to a $(i+1)^{th}$ digital input bit when the normal encoding scheme is selected by the $i^{th}$ encoder, wherein the $i^{th}$ encoder is to set a second output of the $i^{th}$ encoder to 1, wherein the n sequential circuits includes the $i^{th}$ sequential circuit, and wherein the second output is received by the digital-to-analog converter and an input of the $i^{th}$ sequential circuit.

8. The apparatus of claim 6, wherein the digital-to-analog converter includes a plurality of elements, and wherein an individual element includes a capacitor or a resistor, wherein the mismatch errors are from the plurality of elements.

9. A method comprising:
   receiving an N-bit digital input;
   encoding the N-bit digital input to generate an encoded (N+1)-bit digital output; and
   providing the encoded (N+1)-bit digital output to a digital-to-analog converter, wherein the encoded (N+1)-bit digital output is to shape mismatch errors in the digital-to-analog converter.

10. The method of claim 9 further comprising:
    selecting a normal encoding scheme or an alternate encoding scheme for an $i^{th}$ encoder, wherein a first value of a first output and a second value of a second output of the $i^{th}$ encoder depends on whether the normal encoding scheme or the alternate encoding scheme is applied.

11. The method of claim 10 further comprising:
    adding a 1 to a i+1 digital input bit when the alternate encoding scheme is selected;
    setting the second output of the $i^{th}$ encoder to −1; and
    sampling the second output by a clock to generate a sampled second output, wherein the second output is received by the digital-to-analog converter.

12. The method of claim 10 further comprising:
    adding a 0 to a i+1 digital input bit when the normal encoding scheme is selected;
    setting the second output of the $i^{th}$ encoder to 1; and
    sampling the second output by a clock to generate a sampled second output, wherein the second output is received by the digital-to-analog converter.

13. A method for converting a N-bit binary coded input digital signal into an analog output signal, the method comprising:
    accumulating a positive or negative usage of an individual digital-to-analog converter element to generate an accumulated positive or negative usage;
    encoding an individual digital bit, of the N-bit binary coded input digital signal, with a normal scheme or an alternate scheme depending on the accumulated positive or negative usage, such that through negative feedback, an accumulated error contributed from the individual digital bit is bounded close to zero; and
    providing the individual digital bit, which is encoded, to an (N+1)-bit binary weighted digital-to-analog converter which converts an (N+1)-bit digital signal into the analog output signal, wherein the (N+1)-bit binary weighted digital-to-analog converter includes the individual digital-to-analog converter element.

14. The method of claim 13, wherein the normal scheme is applied when the individual digital bit is 1 and the accumulated error is 0, and wherein the alternate scheme is applied when the individual digital bit is −1 and the accumulated error is 1.

15. The method of claim 13, further comprising adding a carry or borrow signal to a next higher bit of the N-bit binary coded input digital signal.

16. The method of claim 15, wherein encoding the individual digital bit is to result in an individual encoded digital bit, wherein the individual encoded digital bit is one of −1, 0, +1, and wherein the carry or borrow signal is one of −1, 0, or +1.

17. The method of claim 16, wherein accumulating the positive or negative usage is performed by an N 1-bit up/down counter.

18. A method for shaping mismatch errors in a digital-to-analog converter, the method comprising:
  storing an accumulated digital value associated with an output bit;
  selecting an encoding scheme for an input bit based on the accumulated digital value to reduce the accumulated digital value to zero;
  generating an encoded digital value based on the encoding scheme; and
  applying the encoded digital value to the digital-to-analog converter having the mismatch errors such that the mismatch errors are shaped in frequency domain.

19. The method of claim 18 further comprising:
  adding an overflow or an underflow from the input bit to a next higher bit; and
  calculating a second overflow or underflow and computing an additional digital output based on adding the overflow or the underflow.

20. The method of claim 19, wherein the input bit is part of a binary coded input signal, wherein the encoded digital value is ternary coded.

* * * * *